US012795987B2

(12) United States Patent
Moriya

(10) Patent No.: US 12,795,987 B2
(45) Date of Patent: Nov. 10, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventor: Taro Moriya, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 750 days.

(21) Appl. No.: 18/065,085

(22) Filed: Dec. 13, 2022

(65) Prior Publication Data

US 2023/0290877 A1 Sep. 14, 2023

(30) Foreign Application Priority Data

Mar. 11, 2022 (JP) ................................ 2022-038218

(51) Int. Cl.

*H10D 30/66* (2025.01)
*H10D 30/01* (2025.01)
*H10D 62/13* (2025.01)
*H10D 64/27* (2025.01)
*H10P 30/20* (2026.01)

(52) U.S. Cl.

CPC ....... *H10D 30/668* (2025.01); *H10D 30/0297* (2025.01); *H10D 62/153* (2025.01); *H10D 62/155* (2025.01); *H10D 64/513* (2025.01); *H10P 30/204* (2026.01); *H10P 30/21* (2026.01); *H10P 30/222* (2026.01)

(58) Field of Classification Search

CPC .. H10D 30/668; H10D 64/513; H10D 62/153; H10D 64/687

See application file for complete search history.

(56) References Cited

U.S. PATENT DOCUMENTS 7,372,088 B2 5/2008 Miyata et al.
9,515,153 B2 12/2016 Uchimura et al.
(Continued)

FOREIGN PATENT DOCUMENTS

JP 2005-244168 A 9/2005
JP 2006-059940 A 3/2006
(Continued)

OTHER PUBLICATIONS

Office Action dated May 20, 2025, from corresponding Japan Application No. 2022-038218, 14 pages.
(Continued)

*Primary Examiner* — Joseph C. Nicely
(74) *Attorney, Agent, or Firm* — Rimon P.C.

(57) ABSTRACT

A semiconductor substrate has a first surface, a second surface opposing the first surface, and a trench extending from the second surface toward the first surface. A gate electrode is arranged in the trench and has a lower end located at a bottom of the trench and an upper end opposing the lower end. The upper end is located in a first surface side with respect to the second surface. An n-type source region has a first region having a first concentration, and a second region having a second concentration higher than the first concentration. The first region has a portion located in the first surface side with respect to an upper end of the gate electrode. The second region is located in the second surface side with respect to the upper end of the gate electrode.

5 Claims, 13 Drawing Sheets

(56) References Cited

U.S. PATENT DOCUMENTS

| | | | | |
|---|---|---|---|---|
| 10,847,613 | B2 | 11/2020 | Naito | |
| 2003/0001203 | A1* | 1/2003 | Ono | H10D 62/157 257/329 |
| 2003/0075759 | A1 | 4/2003 | Kawano et al. | |
| 2007/0290260 | A1* | 12/2007 | Adan | H10D 30/0297 257/E21.409 |
| 2009/0272982 | A1* | 11/2009 | Nakamura | H10D 30/668 257/77 |
| 2010/0006861 | A1* | 1/2010 | Yamamoto | H10D 62/153 257/77 |
| 2013/0037881 | A1* | 2/2013 | Mizokuchi | H10D 30/025 438/270 |
| 2013/0069146 | A1 | 3/2013 | Okumura et al. | |
| 2014/0210000 | A1* | 7/2014 | Tokuda | H10D 30/665 438/270 |
| 2015/0011066 | A1* | 1/2015 | Mizokuchi | H10D 30/025 438/270 |
| 2017/0271507 | A1* | 9/2017 | Suzuki | H10D 30/0297 |
| 2019/0305079 | A1* | 10/2019 | Osuga | H10D 30/668 |
| 2021/0384343 | A1* | 12/2021 | Takeuchi | H10D 30/664 |

FOREIGN PATENT DOCUMENTS

| | | |
|---|---|---|
| JP | 2016-035996 A | 3/2016 |
| JP | 2019-125724 A | 7/2019 |

OTHER PUBLICATIONS

German Office Action dated Sep. 25, 2023 issued in the corresponding German Patent Application No. 102023202027.0, with English translation.

Office Action issued in corresponding Taiwanese Patent Application No. 112107229, dated Aug. 31, 2026.

* cited by examiner

SEMICONDUCTOR DEVICE AND METHOD OF MANUFACTURING THE SAME

CROSS-REFERENCE TO RELATED APPLICATIONS

The present application claims priority from Japanese Patent Application No. 2022-038218 filed on Mar. 11, 2022, the content of which is hereby incorporated by reference to this application.

BACKGROUND

The present disclosure relates to a semiconductor device and a method of manufacturing the semiconductor device, for example, to a technique effectively applicable to a semiconductor device and a method of manufacturing the semiconductor device, which have a trench gate field effect transistor(s).

Conventionally, a semiconductor device having a trench gate field effect transistor is disclosed in, for example, Japanese Patent Application Laid-open No. 2016-35996 (Patent Document 1). In Patent Document 1, the trench gate field effect transistor has a trench and a gate electrode formed in the trench with a gate insulating film interposed therebetween. A sidewall insulating film is formed on the gate electrode and on a side wall of the trench.

SUMMARY

It is desired to enhance further reliability than that of the semiconductor device having a configuration disclosed in Patent Document 1.

The other problems and novel features will be apparent from the descriptions of the present specification and the accompanying drawings.

According to a semiconductor device related to one embodiment, a semiconductor substrate has a first surface, a second surface opposing the first surface, and a trench extending from the second surface toward the first surface. A gate electrode is arranged in the trench and has a lower end located at a bottom of the trench and an upper end opposing the lower end. The upper end is located in a first surface side with respect to the second surface. A source region has a first region having a first concentration, and a second region having a second concentration higher than the first concentration. The first region has a portion located in the first surface side with respect to an upper end of the gate electrode. The second region is located in the second surface side with respect to the upper end of the gate electrode.

According to a method of manufacturing a semiconductor device related to one embodiment, a semiconductor substrate having a first surface, a second surface opposing the first surface, and a trench extending from the second surface toward the first surface is prepared. A gate electrode having a lower end located at a bottom of the trench and an upper end opposing the lower end and located in a first surface side with respect to the second surface is formed in the trench with a gate insulating film interposed therebetween. A source region is formed in the semiconductor substrate. Forming the source region includes: forming a first region, the first region having a portion located in the first surface side with respect to an upper end of the gate electrode and having a first concentration; and forming a second region, the second region being located in the second surface side with respect to the upper end of the gate electrode and having a second concentration higher than the first concentration.

According to the above-mentioned embodiments, realization of the semiconductor device and its manufacturing method that have high reliability becomes possible.

DETAILED DESCRIPTION

Figure 1:
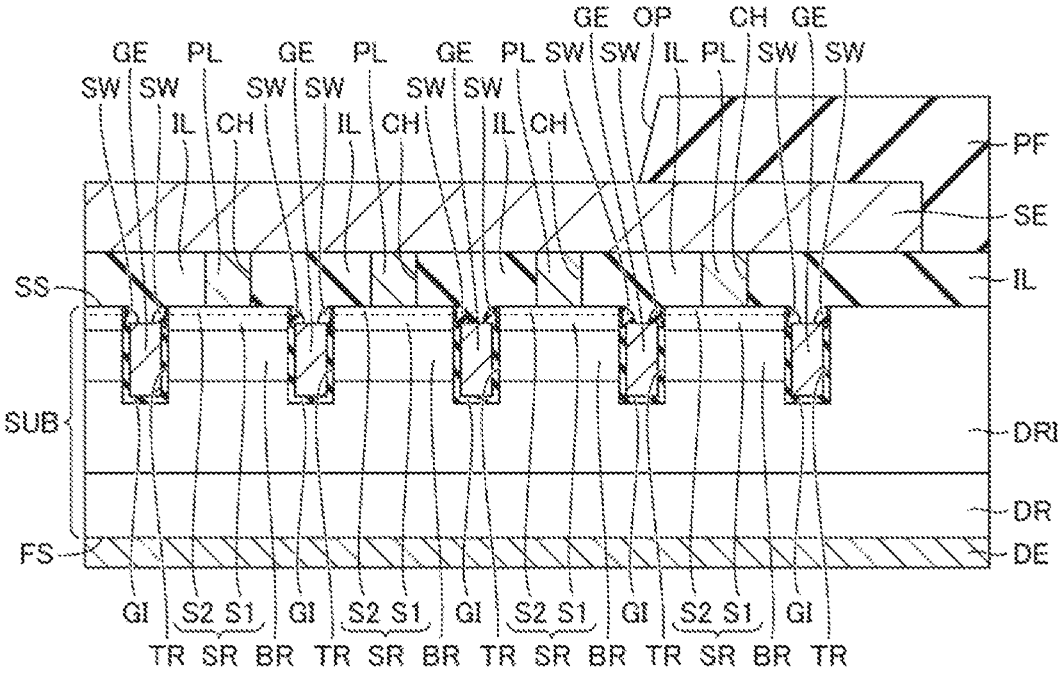
FIG. 1 is a sectional view showing a configuration of a semiconductor device according to a first embodiment.

Hereinafter, embodiments of the present disclosure will be described in detail with reference to the drawings. Incidentally, in the specification and drawings, the same components or corresponding components are denoted by the same reference numerals, and an overlapping description thereof will not be repeated. Also, in the drawings, the configuration may be omitted or simplified for convenience of explanation. Further, at least part of each embodiment and modification example may be combined arbitrarily with each other.

Incidentally, semiconductor devices of embodiments described below are not limited to semiconductor chips, and may be semiconductor wafers before being divided into the semiconductor chips or may be semiconductor packages in which the semiconductor chips are sealed with resins. In addition, a plan view in this specification means a viewpoint seen from a direction perpendicular to a surface of a semiconductor substrate.

First Embodiment

<Configuration of Semiconductor Device>

Firstly, a configuration of a semiconductor device according to a first embodiment will be described with reference to FIGS. 1 to 3.

As shown in FIG. 1, a semiconductor device according to a first embodiment includes a semiconductor substrate SUB and a vertical trench gate field effect transistor. This field effect transistor is, for example, a MISFET (Metal Insulator Semiconductor Field Effect Transistor), specifically a power MOS (Metal Oxide Semiconductor) transistor. This field effect transistor is formed on the semiconductor substrate SUB.

Incidentally, a material of a gate insulating film G1 used for this field effect transistor is not limited to a silicon oxide film, and another material such as a silicon nitride film may be used. Further, although an n-channel field effect transistor is described below, the transistor to which the present disclosure is applied may be a p-channel field effect transistor.

The semiconductor substrate SUB has a first surface FS and a second surface SS. The first surface FS and the second surface SS oppose each other. The semiconductor substrate SUB is made of, for example, monocrystalline silicon. Trenches TR are provided in the semiconductor substrate SUB. The trench TR extends from the second surface SS of the semiconductor substrate SUB toward the first surface FS.

An insulated gate field effect transistor is a vertical transistor that allows a current to flow between the first surface FS and the second surface SS of the semiconductor substrate SUB. The insulated gate field effect transistor includes an n+drain region DR, an n-type drift region DRI, a p-type base region BR, an n-type source region SR, the gate insulating film G1, and a gate electrode GE. Each of the n+drain region DR, the n-type drift region DRI, the p-type base region BR, and the n-type source region SR is arranged in the semiconductor substrate.

The n+drain region DR is arranged on the first surface FS of the semiconductor substrate SUB. The n-type drift region DRI is arranged in a second surface SS side with respect to the n+drain region DR, and touches the n+drain region DR.

The n-type drift region DRI has an n-type impurity concentration lower than an impurity concentration of the n+drain region DR.

The p-type base region BR is arranged in the second surface SS side with respect to the n-type drift region DRI, and forms a pn junction with the n-type drift region DRI. The n-type source region SR is arranged in the second surface SS side with respect to the p-type base region BR, and forms a pn junction with the p-type base region BR. The n-type source region SR is arranged on the second surface SS of the semiconductor substrate SUB.

The trench TR extends from the second surface SS via each of the n-type source region SR and the p-type base region BR to reach the n-type drift region DRI. The gate insulating film G1 is arranged along a wall surface of the trench TR. The gate insulating film G1 is made of, for example, a silicon oxide film, but is not limited to this.

The gate electrode GE is arranged in the trench TR with the gate insulating film G1 interposed therebetween. The gate electrode GE is made of, for example, polycrystalline silicon (doped polysilicon) into which an impurity is introduced. The gate electrode GE opposes the p-type base region BR with the gate insulating film G1 interposed therebetween. A sidewall insulating film SW is arranged on the gate electrode GE so as to cover a side wall of the trench TR.

An interlayer insulating layer IL is arranged on the second surface SS of the semiconductor substrate SUB. The interlayer insulating layer IL is made of, for example, a silicon oxide film. The interlayer insulating layer IL has a BPSG (Boro-Phospho Silicate Glass) film made of, for example, TEOS (Tetra Ethyl Ortho Silicate).

Contact holes CH are provided in the interlayer insulating layer IL. The contact hole CH penetrates the interlayer insulating layer IL, and reaches the semiconductor substrate SUB. The contact hole CH reaches an n-type source region SR. Incidentally, although not shown, a contact hole(s) reaching the gate electrode GE is also provided in the interlayer insulating layer IL.

A conductive layer PL is embedded in the contact hole CH. The conductive layer PL is connected to the n-type source region SR. The conductive layer PL includes a barrier metal layer and a buried conductive layer. The barrier metal layer is formed along the wall surface of the contact hole CH, and is made of, for example, a laminated film of titanium (Ti) and titanium nitride (TiN). The buried conductive layer is embedded inside the contact hole CH, and is made of, for example, tungsten (W).

A source electrode SE is arranged on the interlayer insulating layer IL. The source electrode SE is electrically connected to the n-type source region SR via the conductive layer PL. An insulating film PF is arranged on the interlayer insulating layer IL so as to cover part of the source electrode SE. The insulating film PF is a passivation film made of, for example, a polyimide-based resin or the like. An opening OP is provided in the insulating film PF. A part of the source electrode SE is exposed from the opening OP. The part of the source electrode SE exposed from the opening OP constitutes a source bonding pad.

A drain electrode DE is arranged on the first surface FS of the semiconductor substrate SUB. The drain electrode DE is electrically connected to the n+drain region DR by touching the n+drain region DR.

Figure 2:
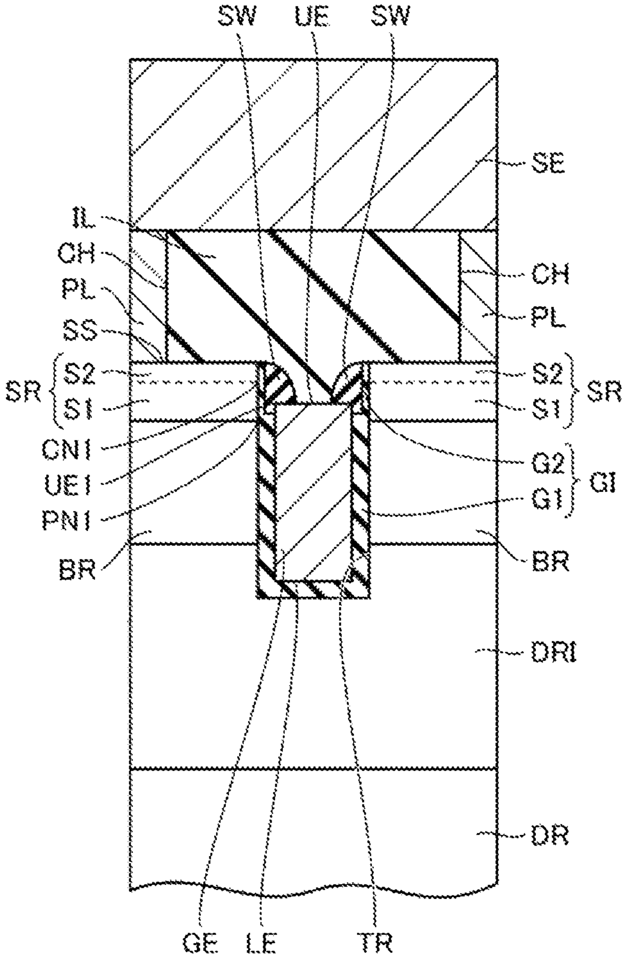
FIG. 2 is an enlarged sectional view enlargedly showing a periphery of a trench of FIG. 1.

As shown in FIG. 2, the gate electrode GE has a lower end LE positioned at a bottom of the trench TR and an upper end UE opposing the lower end LE. The upper end UE of the gate electrode GE is located in the first surface FS (FIG. 1) side from the second surface SS of the semiconductor substrate SUB.

The gate insulating film G1 has a first insulating film G1 and a second insulating film G2. The first insulating film G1 is arranged along a bottom wall of the trench TR and a lower side (first surface FS side) of the side wall of the trench TR. An end portion of the first insulating film G1 in the second surface SS side is located in the first surface FS side with respect to a position of the upper surface of the gate electrode GE.

The second insulating film G2 is located in an upper side (in the second surface SS side) with respect to the first insulating film G1, and is arranged along the side wall of the trench TR. The second insulating film G2 is connected to an end portion of the first insulating film G1 in the second surface SS side. A thickness of the second insulating film G2 (a thickness in a direction orthogonal to a direction from the second surface SS to the first surface FS) is thinner than a thickness of the first insulating film G1.

A recess portion is formed between the gate electrode GE and the gate insulating film G1. The bottom wall of this recess portion is formed by an upper surface (an end surface in the second surface SS side) of the first insulating film G1. One side wall of the recess portion is formed by the side wall of the gate electrode GE, and the other side wall of the recess portion is formed by the side wall of the second insulating film G2.

The first insulating film G1 and the second insulating film G2 are mutually made of the same material. The first insulating film G1 and the second insulating film G2 are made of, for example, a silicon oxide film, but are not limited to this material.

A sidewall insulating film SW is arranged in the second surface SS side of to the gate insulating film G1. Specifically, the sidewall insulating film SW is arranged in the second surface side from the first insulating film G1. The sidewall insulating film SW is arranged along the side wall of the trench TR. The sidewall insulating film SW is made of, for example, a silicon oxide film, but is not limited to this material. A second insulating film G2 of the gate insulating film G1 is located between the sidewall insulating film SW and the side wall of the trench TR.

The sidewall insulating film SW partially covers the upper surface of the gate electrode GE, and is embedded in the recess portion between the gate electrode GE and the sidewall insulating film SW. The interlayer insulating layer IL is arranged on the sidewall insulating film SW. The sidewall insulating film SW touches the interlayer insulating layer IL.

The n-type source region SR has a first region S1 and a second region S2. The first region S1 forms a pn junction with the p-type base region BR. The second region S2 is located in the second surface SS side with respect to the first region S1, and is connected to the first region S1. An n-type impurity concentration of the second region S2 is higher than an n-type impurity concentration of the first region S1.

The first region S1 has a portion located in the first surface FS side from an upper end UE of the gate electrode GE. A pn junction between the first region S1 and the p-type base region BR is located in the first surface FS side from the upper end UE of the gate electrode GE. For example, a portion PN1, which touches the side wall of the trench TR, on the pn junction between the first region S1 and the p-type base region BR is located in the first surface FS side from the portion UE1, which is located closest to the portion PN1, in the upper end UE of the gate electrode GE.

The second region S2 is located in the second surface SS side from the upper end UE of the gate electrode GE. A junction portion (indicated by a broken line in the figure) between the first region S1 and the second region S2 is located in the second surface SS side from the upper end UE of the gate electrode GE. For example, a portion CN1, which touches the side wall of the trench TR, in the junction portion between the first region S1 and the second region S2 is located in the second surface SS side from the portion UE1, which is located closest to the portion CN1, in the upper end UE of the gate electrode GE.

Figure 3B:
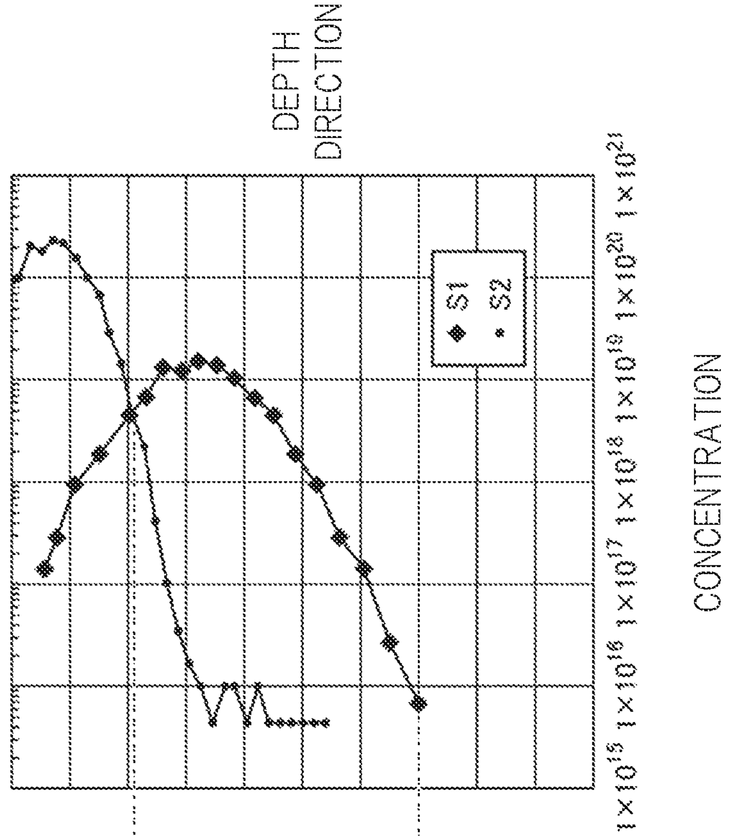
FIG. 3B is a view showing an impurity concentration distribution in a depth direction of the source region.
Figure 3A:
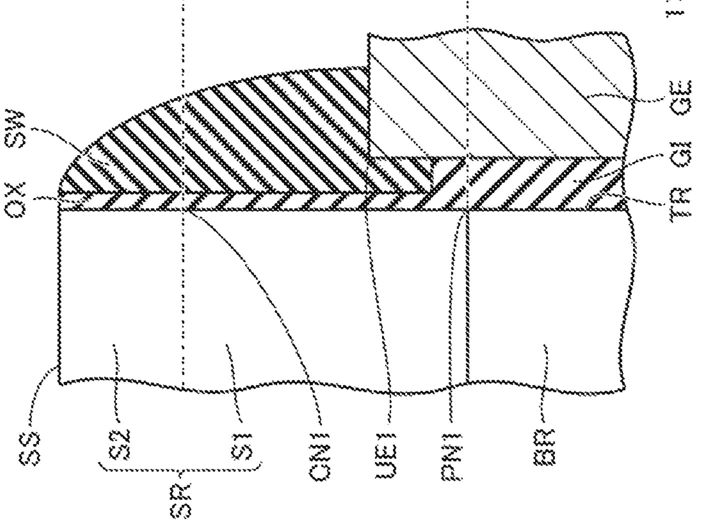
FIG. 3A is an enlarged sectional view showing part of a source region of FIG. 1.

As shown in FIG. 3, an n-type impurity concentration distribution of the first region S1 has a concentration peak in the first surface side rather than on the second surface SS. An n-type impurity of the first region S1 is, for example, phosphorus (P), but is not limited to this.

An n-type impurity concentration distribution of the second region S2 has a concentration peak at a position closer to the second surface SS side than a position of the concentration peak of the first region S1. An n-type impurity of the second region S2 is, for example, arsenic (As), but is not limited to this.

The concentration peak in the first region S1 is, for example, about $1\times10^{19}$ $cm^{-3}$. The concentration peak in the second region S2 is, for example, about $1\times10^{20}$ $cm^{-3}$. The n-type impurity concentration at the concentration peak of the second region S2 is higher than the n-type impurity concentration at the concentration peak of the first region S1. The n-type impurity concentration at the concentration peak of the second region S2 may be, for example, ten times or higher than the n-type impurity concentration at the concentration peak of the first region S1.

At the pn junction between the first region S1 and the p-type base region BR, the n-type impurity concentration in the first region S1 and the p-type impurity concentration in the p-type base region BR become substantially the same. At the junction portion between the first region S1 and the second region S2, the n-type impurity concentration in the first region S1 and the n-type impurity concentration in the second region S2 become substantially the same.

<Manufacturing method of Semiconductor Device>

Next, a manufacturing method of the semiconductor device according to the first embodiment will be described with reference to FIGS. 4 to 14.

Figure 4:
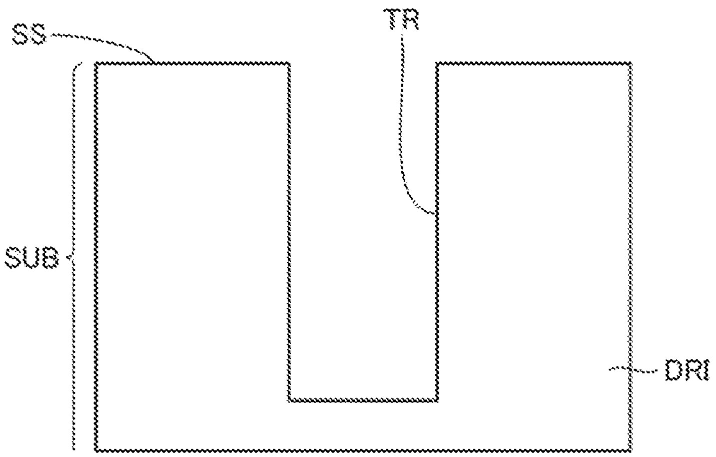
FIG. 4 is a sectional view showing a first step of a manufacturing method of the semiconductor device according to the first embodiment.

As shown in FIG. 4, a semiconductor substrate SUB having a first surface FS (FIG. 1) and a second surface SS, which oppose each other, is prepared. At least an n-type drift region DRI is formed in the semiconductor substrate SUB. A trench TR is formed in the second surface SS of the semiconductor substrate SUB by photomechanical technology and etching technology. The trench TR is formed to extend from the second surface SS toward the first surface FS. As described above, prepared is the semiconductor substrate SUB having the first surface FS, the second surface SS opposing the first surface FS, and the trench TR extending from the second surface SS toward the first surface FS.

Figure 5:
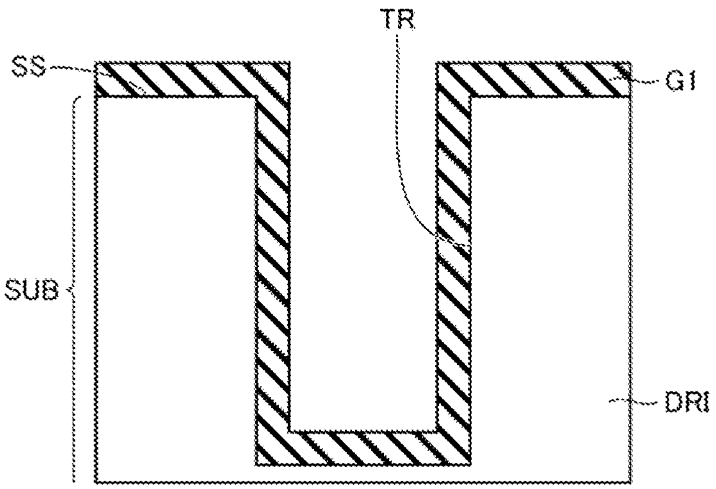
FIG. 5 is a sectional view showing a second step of a manufacturing method of the semiconductor device according to the first embodiment.

As shown in FIG. 5, the second surface SS of the semiconductor substrate SUB and an inner wall (side wall and bottom wall) of the trench TR are oxidized. Consequently, a first insulating film G1 made of a silicon oxide film is formed on the second surface SS of the semiconductor substrate SUB and the inner wall of the trench TR.

Figure 6:
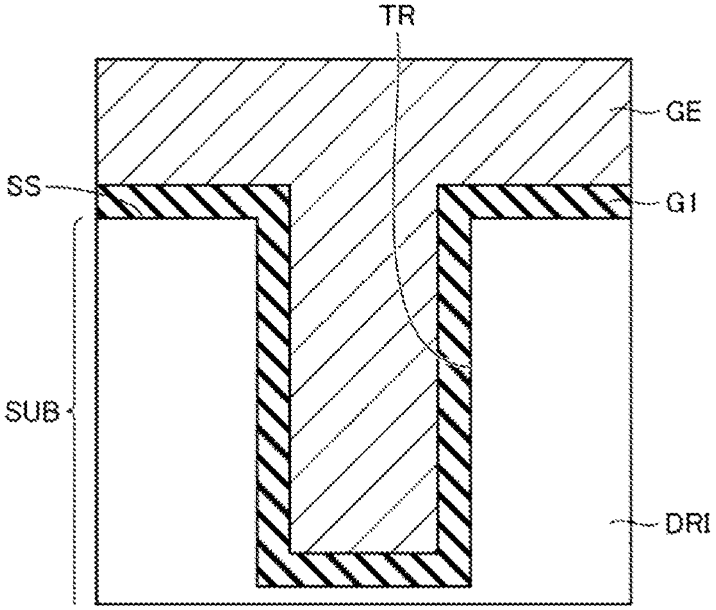
FIG. 6 is a sectional view showing a third step of a manufacturing method of the semiconductor device according to the first embodiment.

As shown in FIG. 6, a conductive layer GE made of doped polysilicon for a gate electrode is 1 formed on the first insulating film G1 so as to be embedded in the trench TR. The conductive layer GE may be formed by doping the polycrystalline silicon with an impurity after the polycrystalline silicon is formed on the second surface SS. Alternatively, the conductive layer GE may be formed by polycrystalline silicon, which is doped with the impurity, being film-formed on the second surface SS.

Figure 7:
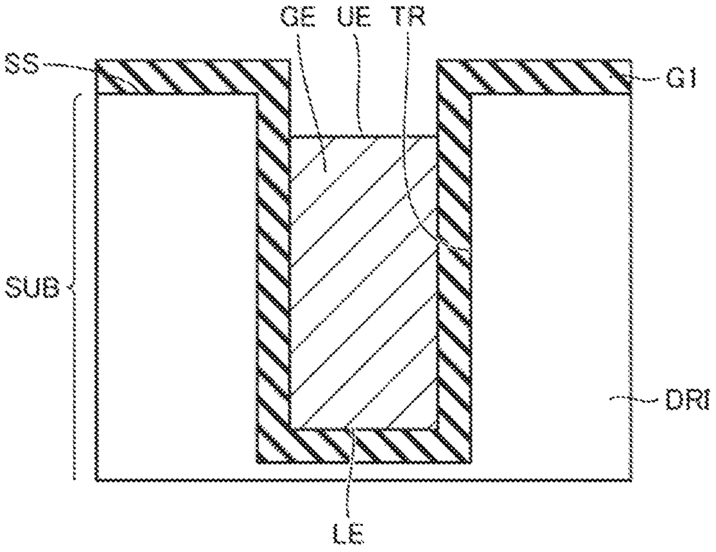
FIG. 7 is a sectional view showing a fourth step of a manufacturing method of the semiconductor device according to the first embodiment.

As shown in FIG. 7, the conductive layer GE is removed by etching until at least a surface of the first insulating film G1 is exposed. Consequently, the conductive layer GE remains in the trench TR. The conductive layer GE left in the trench TR forms the gate electrode GE. The gate electrode GE is formed to have the lower end LE located at the bottom of the trench TR and an upper end UE opposing the lower end LE. By the above-mentioned etching, the conductive layer GE is removed by the etching so that the upper end UE of the gate electrode GE is located in the first surface FS side rather than on the second surface SS of the semiconductor substrate SUB.

Figure 8:
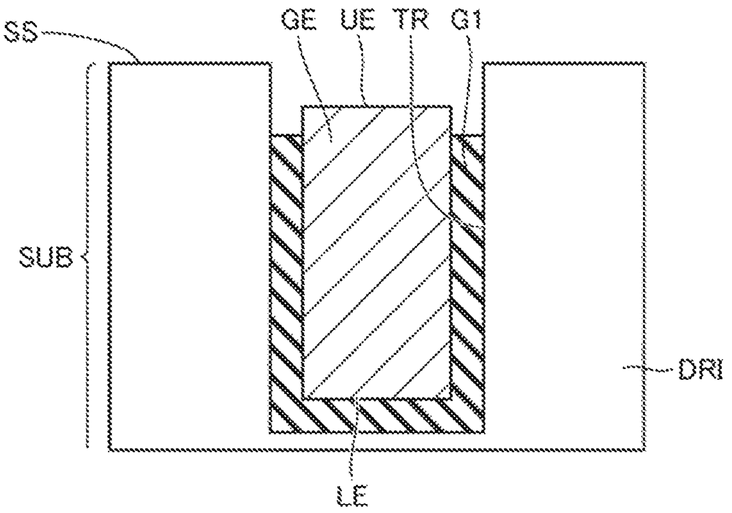
FIG. 8 is a sectional view showing a fifth step of a manufacturing method of the semiconductor device according to the first embodiment.

As shown in FIG. 8, the first insulating film G1 is removed by wet etching until at least the second surface SS of the semiconductor substrate SUB is exposed. At this time, the first insulating film G1 is removed by the etching so that the upper end of the first insulating film G1 (the end portion in the second surface SS side) is located in the first surface FS side rather than on the upper end UE of the gate electrode GE.

Figure 9:
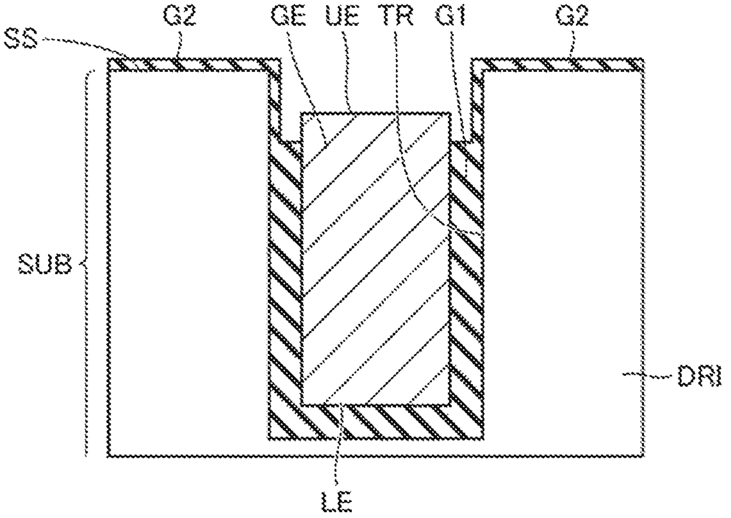
FIG. 9 is a sectional view showing a sixth step of a manufacturing method of the semiconductor device according to the first embodiment.

As shown in FIG. 9, the second surface SS of the semiconductor substrate SUB and the side wall of the trench TR are oxidized. Consequently, a second insulating film G2 made of a silicon oxide film is formed on the second surface SS of the semiconductor substrate SUB and the side wall of the trench TR. Incidentally, although not shown, the upper surface and side surface of the gate electrode GE may be oxidized during this oxidation. The second insulating film G2 is formed so as to be connected to the upper end (the end portion in the second surface SS side) of the first insulating film G1. A recess portion is formed between the gate electrode GE and the second insulating film G2.

Figure 10:
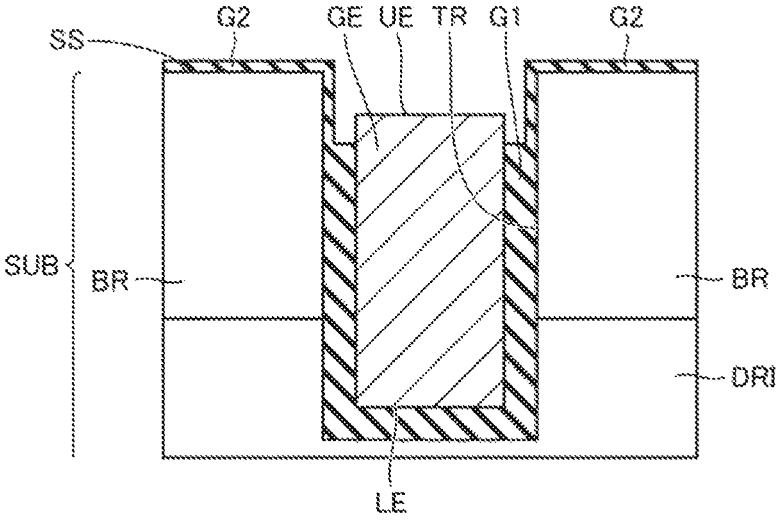
FIG. 10 is a sectional view showing a seventh step of a manufacturing method of the semiconductor device according to the first embodiment.

As shown in FIG. 10, a p-type impurity (for example, boron (B)) is implanted into the semiconductor substrate SUB from the second surface SS side of the semiconductor substrate SUB by ion implantation. Consequently, the p-type base region BR is formed in the second surface SS of the semiconductor substrate SUB. The p-type base region BR is formed so as to be located in the second surface SS side with respect to the n-type drift region DRI and to configure a pn junction with the n-type drift region DRI.

Figure 11:
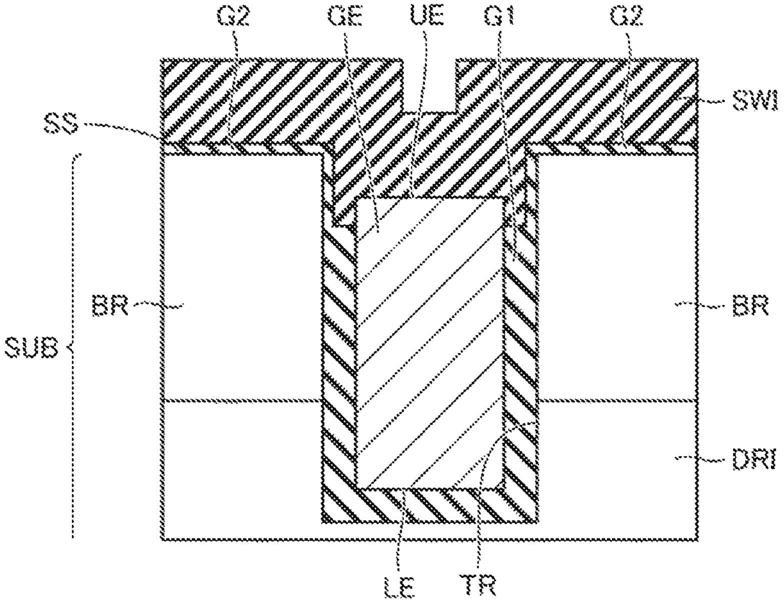
FIG. 11 is a sectional view showing an eighth step of a manufacturing method of the semiconductor device according to the first embodiment.

As shown in FIG. 11, an insulating film SWI is formed on the second insulating film G2 so as to be embedded in the trench TR. The insulating film SWI is made of, for example, a silicon oxide film. Thereafter, the insulating films SWI and G2 are anisotropically etched. This anisotropic etching is performed until the second surface SS of the semiconductor substrate SUB and the upper surface of the gate electrode GE are exposed.

Figure 12:
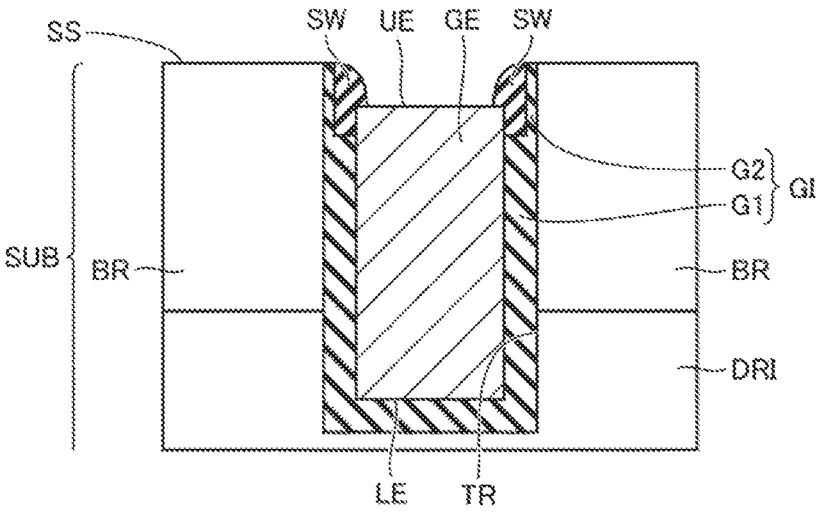
FIG. 12 is a sectional view showing a nineth step of a manufacturing method of the semiconductor device according to the first embodiment.

As shown in FIG. 12, the above-mentioned anisotropic etching removes the second insulating film G2 on the second surface SS, but leaves the second insulating film G2 along the side wall of the trench TR. The remaining second insulating film G2 forms the gate insulating film G1 together with the first insulating film G1.

Further, the sidewall insulating film SW is formed from the insulating film SWI by the above-mentioned anisotropic etching. The sidewall insulating film SW is formed so as to sandwich the second insulating film G2 between the sidewall insulating film SW and the side wall of the trench TR. The sidewall insulating film SW is formed along the side wall of the trench TR on the second surface SS side rather than on the first insulating film G1 of the gate insulating film G1. The sidewall insulating film SW is also formed so as to partially cover the upper surface of the gate electrode GE and be embedded in the recess portion between the gate electrode GE and the gate insulating film G1.

Figure 13:
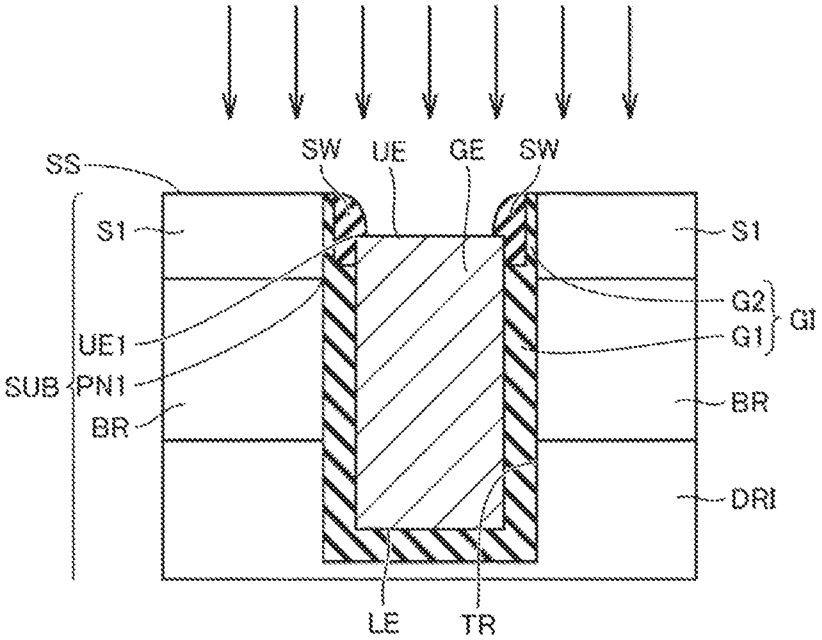
FIG. 13 is a sectional view showing a tenth step of a manufacturing method of the semiconductor device according to the first embodiment.

As shown in FIG. 13, n-type impurities (for example, phosphorus) are ion-implanted into the semiconductor substrate SUB from the second surface SS side of the semiconductor substrate SUB. This ion implantation is performed under the condition of, for example, an implantation energy of 50 keV or more to 100 keV or less and a dose of $1.0\times10^{14}$ atoms/$cm^2$ or less. Further, this ion implantation is also performed in a state in which the sidewall insulating film SW is arranged on the second surface SS side rather than on the first insulating film G1 of the gate insulating film G1.

A first region S1 is formed on the second surface SS of the semiconductor substrate SUB by this ion implantation. The first region S1 is formed to be located in the second surface SS side with respect to the p-type base region BR and to form a pn junction with the p-type base region BR.

The first region S1 is formed to have a portion located in the first surface FS side rather than on the upper end UE of the gate electrode GE. The first region S1 is formed so that the pn junction between the first region S1 and the p-type base region BR is located in the first surface FS side rather than on the upper end UE of the gate electrode GE. For example, the first region S1 is formed so that a portion PN1, which touches the side wall of the trench TR, in the pn junction between the first region S1 and the p-type base region BR is located in the first surface FS side rather than on the portion UE1, which is closest to the portion PN1, in the upper end UE of the gate electrode GE.

Figure 14:
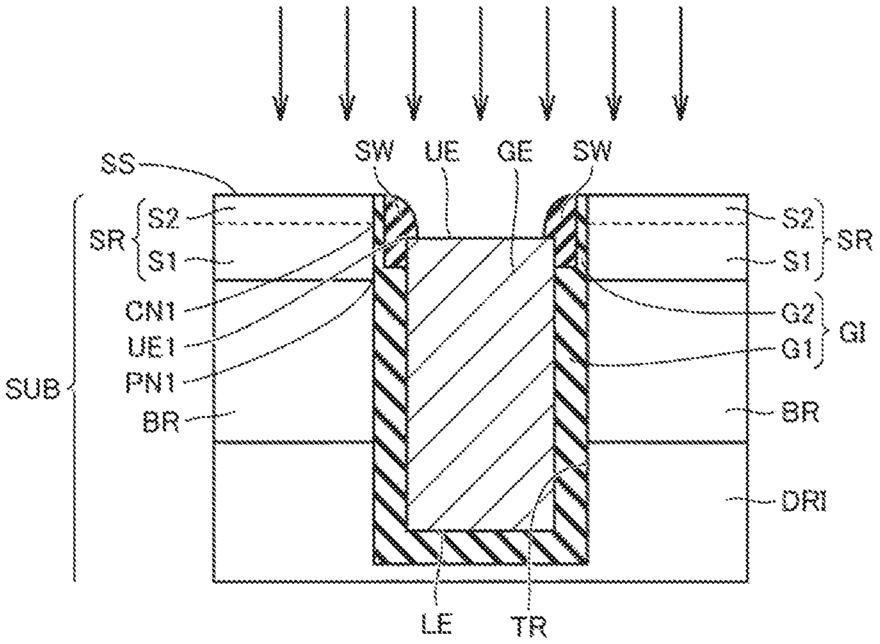
FIG. 14 is a sectional view showing an eleventh step of a manufacturing method of the semiconductor device according to the first embodiment.

As shown in FIG. 14, an n-type impurity (for example, arsenic) is ion-implanted into the semiconductor substrate SUB from the second surface SS side of the semiconductor substrate SUB. This ion implantation is performed under conditions of having energy lower than the implantation energy of the impurity ions for forming the first region S1 and a dose higher than the dose of impurity ions for forming the first region S1. This ion implantation is performed under conditions of, for example, an implantation energy of 10 keV or more to 40 keV or less and a dose of about $1.0\times10^{16}$ atoms/$cm^2$. Further, this ion implantation is performed in a state in which the sidewall insulating film SW is arranged in the second surface SS side rather than on the first insulating film G1 of the gate insulating film G1.

Consequently, a second region S2 is formed on the second surface SS of the semiconductor substrate SUB. The second region S2 is formed so as to be located in a second surface SS side with respect to the first region S1 and to join with the first region S1.

The second region S2 is formed to be located in the second surface SS side rather than on the upper end UE of the gate electrode GE. The second region S2 is formed to have an n-type impurity concentration higher than that of the first region S1. The second region S2 is formed so that a junction portion between the first region S1 and the second region S2 is located in the second surface SS side rather than on the upper end UE of the gate electrode GE. For example, the second region S2 is formed so that a portion CN1, which touches the side wall of the trench TR, in the junction portion between the first region S1 and the second region S2 is located in the second surface SS side rather than on the portion UE1, which is closest to the portion CN1 than the portion CN1, in the upper end UE of the gate electrode GE.

After that, as shown in FIG. 1, the semiconductor device of the present embodiment is manufactured by forming an interlayer insulating layer IL, a conductive layer PL, a source electrode SE, a drain electrode DE, an insulating film PF, and the like.

Effect

Next, an effect of the present embodiment will be described by comparing it with first to third comparative examples.

Figure 15:
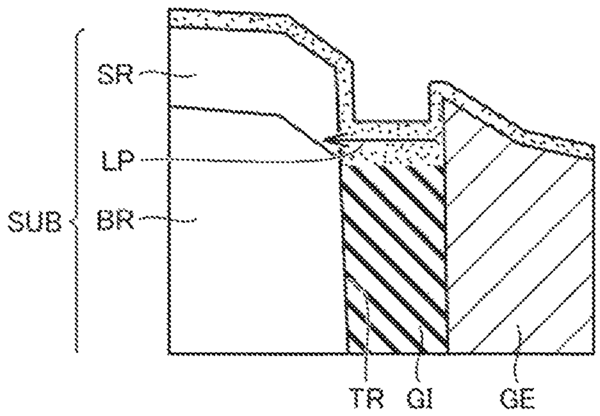
FIG. 15 is a sectional view showing a configuration of a first modification example.

As shown in FIG. 15, in a first comparative example, ion implantation is performed at a high dose for forming an n-type source region SR without forming a sidewall insulating film. In this case, impurity ions may be implanted not only into the semiconductor substrate SUB but also into the gate insulating film G1 at the upper end portion of the trench TR. A region hatched with scattered plots in the figure indicates a region where a high dose of impurity ions is implanted into the gate insulating film G1. The gate insulating film G1 implanted with the impurity ions at a high dose deteriorates due to implantation damage. Consequently, a leak current indicated by an arrow in the figure occurs during use, and the reliability of the gate insulating film G1 is lowered.

Figure 16:
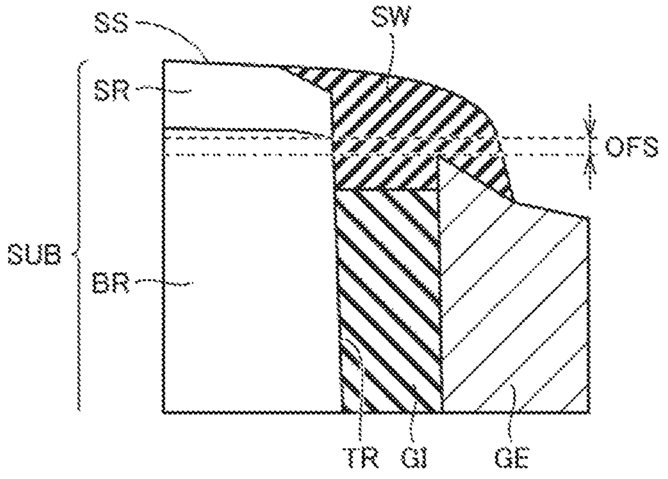
FIG. 16 is a sectional view showing a configuration of a second modification example.

In order to solve this problem, in a second comparative example shown in FIG. 16, the sidewall insulating film SW is arranged on the gate electrode GE and the gate insulating film G1. In this state, the ion implantation is performed at a high dose for forming an n-type source region SR. Therefore, when the n-type source region SR is formed shallowly from the second surface SS, the injection of the impurity ions into the gate insulating film G1 located between the gate electrode GE and the semiconductor substrate SUB is suppressed due the presence of the sidewall insulating film SW.

However, in this case, an offset OFS is generated between the upper end of the gate electrode GE and the lower end of the n-type source region SR. When the offset OFS occurs, the offset OFS causes variations such as a sudden increase in a threshold voltage of the field effect transistor.

Figure 17:
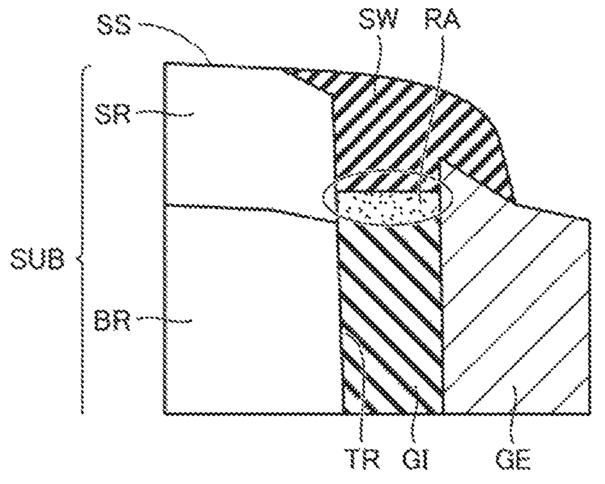
FIG. 17 is a sectional view showing a configuration of a third modification example.

Therefore, as in a third comparative example shown in FIG. 17, the n-type source region SR needs to be formed deeply from the second surface SS so as not to cause the offset OFS. However, in this case, even if the sidewall insulating film SW is arranged, a high dose of impurity ions may be implanted into the gate insulating film G1 between the gate electrode GE and the semiconductor substrate SUB. Therefore, similarly to the above, the gate insulating film G1 into which the impurity ions are implanted at the high dose is deteriorated due to the implantation damage, and the reliability of the gate insulating film G1 is lowered.

Also, in the third comparative example, it is conceivable to implant the impurity ions at a low dose so as not to affect the deterioration of the reliability of the gate insulating film G1. However, in this case, the impurity concentration of the n-type source region SR becomes low, and contact properties between the n-type source region SR and the conductive layer deteriorate.

In contrast, in the present embodiment, as shown in FIGS. 1 and 2, the n-type source region SR has a first region S1 having a first concentration, and a second region S2 having a second concentration higher than the first concentration. Then, the first region S1 has a portion located in the first surface FS side rather than on the upper end UE of the gate electrode GE, and the second region S2 is located in the second surface SS side rather than on the upper end UE of the gate electrode GE. Consequently, it is suppressed that the high dose of impurity ions for forming the second region S2 is implanted into the gate insulating film G1 between the gate electrode GE and the semiconductor substrate SUB. Therefore, the gate insulating film G1 is less likely to be damaged by the implantation of the high dose of impurity ions, and the reliability of the gate insulating film G1 is improved.

In addition, since the second region S2 has a higher n-type impurity concentration than that of the first region S1, deterioration of the contact properties between the second region S2 and the conductive layer PL can also be prevented.

Further, since the first region S1 has the portion located in the first surface FS side rather than the upper end UE of the gate electrode GE, the offset can be prevented from occurring between the n-type source region SR and the gate electrode GE. Therefore, a threshold voltage of the field effect transistor can also be prevented from suddenly increasing or the like.

Figure 18:
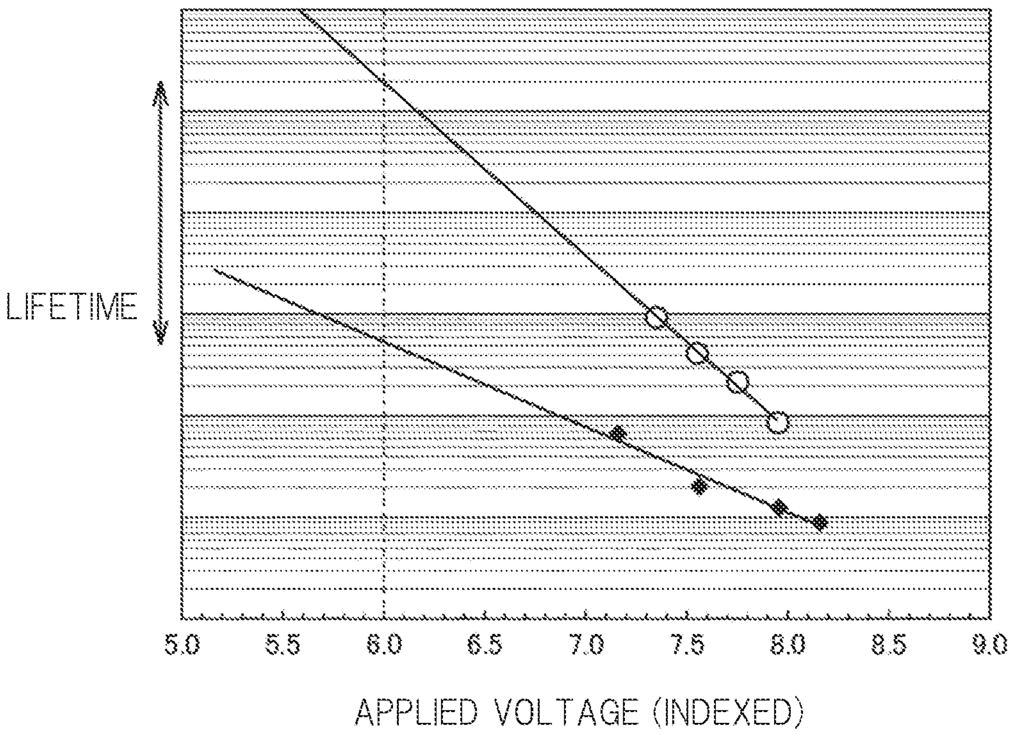
FIG. 18 is a view showing a relationship between an applied voltage and lifetime in being ion-implanted with each of a low dose and a high dose.

Incidentally, since the first region S1 has the portion located in the first surface FS side with respect to the upper end UE of the gate electrode GE, the low dose of impurity ions for forming the first region S1 is implanted into the gate insulating film G1 between the gate electrode GE and the semiconductor substrate SUB. However, the inventors have confirmed that the lifetime of the gate insulating film G1 does not decrease so much even when such a low dose of impurity ions is implanted into the gate insulating film G1. FIG. 18 mentioned below shows a result checked and confirmed by the inventors.

FIG. 18 is a view showing a relationship between an applied voltage and lifetime in being ion-implanted with each of a low dose and a high dose. In FIG. 18, a horizontal axis indicates an indexed applied voltage, and a vertical axis indicates lifetime of the gate insulating film. On the vertical axis, an upper side has longer lifetime, and a lower side has shorter lifetime. Further, each white circle in a graph indicates a low dose of $2.0\times10^{15}$ atoms/cm$^2$, and each black diamond indicates a high dose of $9.0\times10^{15}$ atoms/cm$^2$.

As is clear from the results of FIG. 18, it can be seen that the lifetime of the gate insulating film becomes longer in a case of the low dose than in a case of the high dose. In addition, it can be seen that at an applied voltage of 6.0 V, which is an assumed usage condition, the lifetime of the gate insulating film at the low dose is longer by two digits or more than that at the high dose.

From this, it can be seen that in the semiconductor device of the present embodiment, the gate insulating film G1 can maintain the long lifetime.

Further, in the present embodiment, as shown in FIG. 2, the sidewall insulating film SW is provided. This makes it difficult for the impurity ions to be implanted into the gate insulating film G1 between the gate electrode GE and the semiconductor substrate SUB during the implantation of the high dose of impurity ions shown in FIG. 14. Therefore, the reliability of the gate insulating film G1 can be further improved.

Second Embodiment

<Configuration of Semiconductor Device>

Next, a configuration of a semiconductor device according to a second embodiment will be described with reference to FIG. 19.

Figure 19:
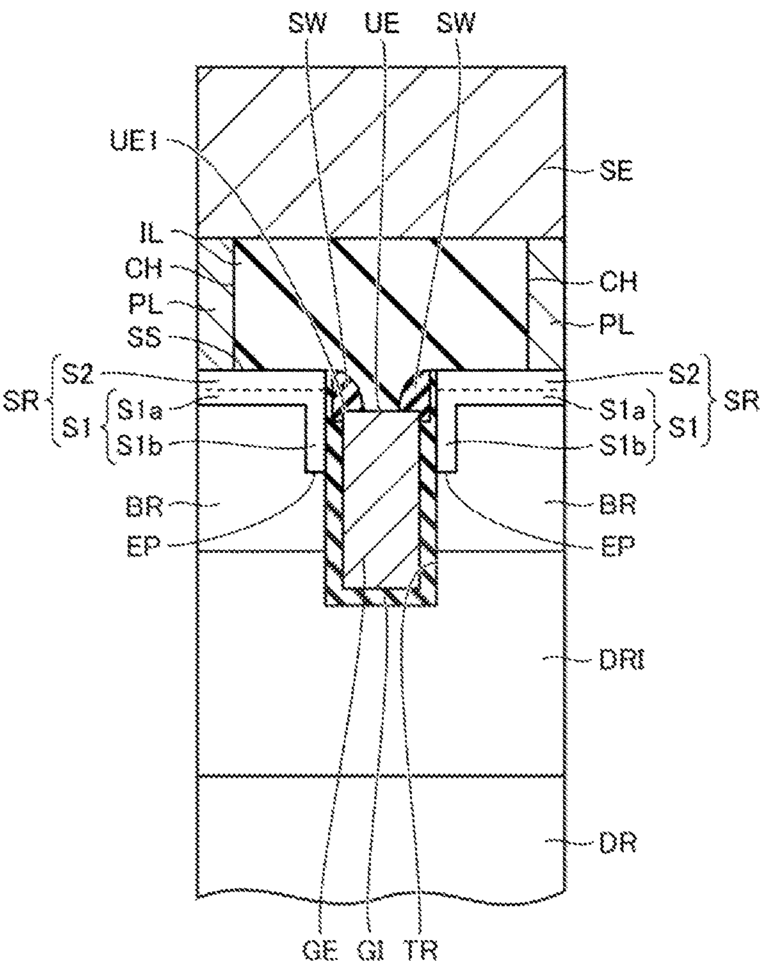
FIG. 19 is a sectional view showing a configuration of a semiconductor device according to a second embodiment.

As shown in FIG. 19, a semiconductor device of the present embodiment differs from that of the first embodiment in a configuration of a n-type source region SR. An n-type source region SR in the present embodiment has a first region S1 and a second region S2. The second region S2 has an n-type impurity concentration higher than that of the first region S1.

The first region S1 has a first portion S1*a* and a second portion S1*b*. The first portion S1*a* is located away from a trench TR. The second portion S1*b* is connected to the first portion S1*a* and extends along a side wall of the trench TR on a first surface FS side rather than the first portion S1*a*. The first portion S1*a* and the second portion Sb mutually have the same n-type impurity concentration.

An end portion EP of the second portion S1*b* on the first surface FS side is located in the first surface FS side with respect to an upper end UE of a gate electrode GE. For example, the first portion S1*a* is formed so that the pn junction between the end portion EP of the second portion S1*b* and the p-type base region BR is located in the first surface FS side with respect to the portion UE1, which is closest to the side wall of the trench TR, in the upper end UE of the gate electrode GE.

Incidentally, the pn junction between the first portion S1*a* and the p-type base region BR is located in a second surface SS side with respect to the upper end UE of the gate electrode GE. For example, the first portion S1*a* is formed so that the pn junction between the first portion S1*a* and the p-type base region BR is located on the second surface SS side rather than the portion UE1, which is closest to the side wall of the trench TR, on the upper end UE of the gate electrode GE.

Further, the pn junction between the first portion S1*a* and the p-type base region BR may be located in the first surface FS side with respect to the upper end UE of the gate electrode GE. Incidentally, since a configuration of the present embodiment other than the above-mentioned configuration is substantially the same as that of the first embodiment, the same elements are denoted by the same reference numerals and a description thereof will not be repeated.

<Manufacturing Method of Semiconductor Device>

Next, a manufacturing method of a semiconductor device according to a second embodiment will be described with reference to FIGS. 20 and 21.

A manufacturing method of the semiconductor device of the present embodiment first undergoes the same steps as those of the first embodiment shown in FIGS. 4 to 10. Thereafter, as shown in FIG. 20, ions of n-type impurities (for example, phosphorus) are obliquely implanted into a semiconductor substrate SUB from the second surface SS side of the semiconductor substrate SUB before the sidewall insulating film SW is formed. This oblique implantation is performed under the condition of, for example, a dose of $1.0\times10^{14}$ atoms/cm$^2$ or less. The oblique implantation is to implant impurity ions into the semiconductor substrate SUB at an angle oblique to the second surface SS of the semiconductor substrate SUB. The oblique implantation is, for example, oblique rotational ion implantation.

A first region S1 is formed on the second surface SS of the semiconductor substrate SUB by this oblique implantation. The first region S1 is formed to have a first portion S1*a* and a second portion S1*b* as described above.

Thereafter, the manufacturing method of the present embodiment undergoes the same steps as those in the first embodiment shown in FIGS. 11 and 12. Then, as shown in FIG. 21, n-type impurities (for example, arsenic) are ion-implanted into the semiconductor substrate SUB from the second surface SS side of the semiconductor substrate SUB. This ion implantation is performed under such a condition as to become larger than the dose of impurity ions for forming the first region S1. This ion implantation is performed under the conditions of, for example, an implantation energy of 10 keV or more to 40 keV or less and a dose of about $1.0\times10^{16}$ atoms/cm$^2$. Also, this ion implantation is performed in a state in which the sidewall insulating film SW is arranged in the second surface SS side rather than the first insulating film G1 of a gate insulating film G1.

Consequently, a second region S2 is formed on the second surface SS of the semiconductor substrate SUB. The second region S2 is formed so as to be located in the second surface SS side with respect to the first region S1 and to be joined with the first region S1.

The second region S2 is formed to be located in the second surface SS side rather than the upper end UE of the gate electrode GE. The second region S2 is formed to have an n-type impurity concentration higher than that of the first region S1. The second region S2 is formed so that the junction portion between the first region S1 and the second region S2 is located in the second surface SS side with respect to the upper end UE of the gate electrode GE. For example, the second region S2 is formed so that a portion CN1, which touches the side wall of the trench TR, on the junction portion between the first region S1 and the second region S2 is located in the second surface SS side rather than the portion UE1, which is closest to the portion CN1, on the upper end UE of the gate electrode GE.

Then, an interlayer insulating layer IL, a conductive layer PL, a source electrode SE, a drain electrode DE, an insulating film PF, and the like are formed in the same manner as in the first embodiment, so that the semiconductor device of the present embodiment is manufactured.

Effect

Next, an effect of the present embodiment will be described. In the present embodiment, as shown in FIG. 19, the second portion S1*b* extends further toward the first surface FS side than the first portion S1*a* along the side wall of the trench TR. This suppresses the occurrence of an offset between the n-type source region SR and the gate electrode GE. Therefore, variations in sudden increase in threshold voltage of the field effect transistor or the like can be prevented from occurring.

Figure 20:
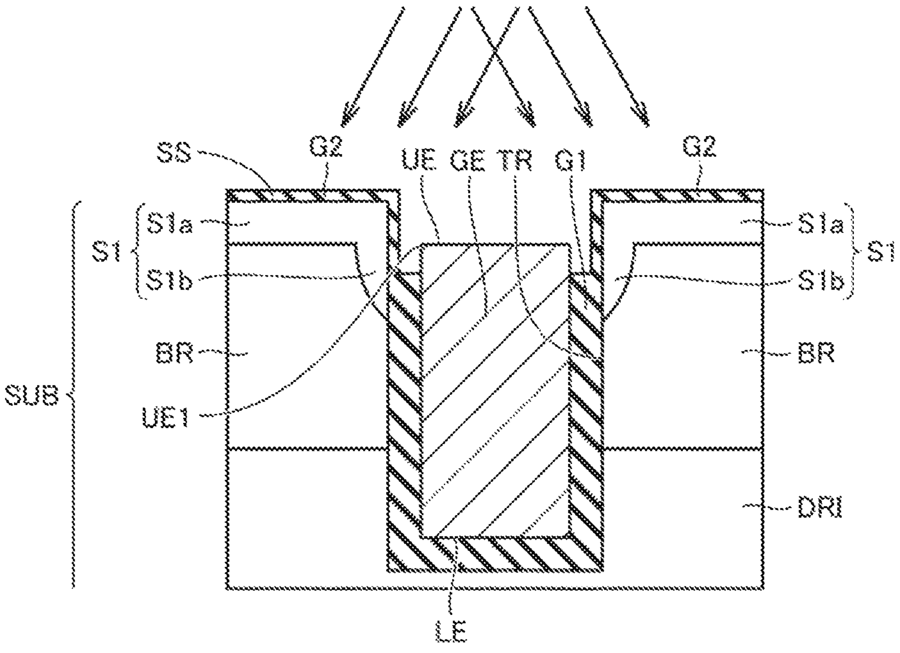
FIG. 20 is a sectional view showing a first step of a manufacturing method of the semiconductor device according to the second embodiment.
Figure 21:
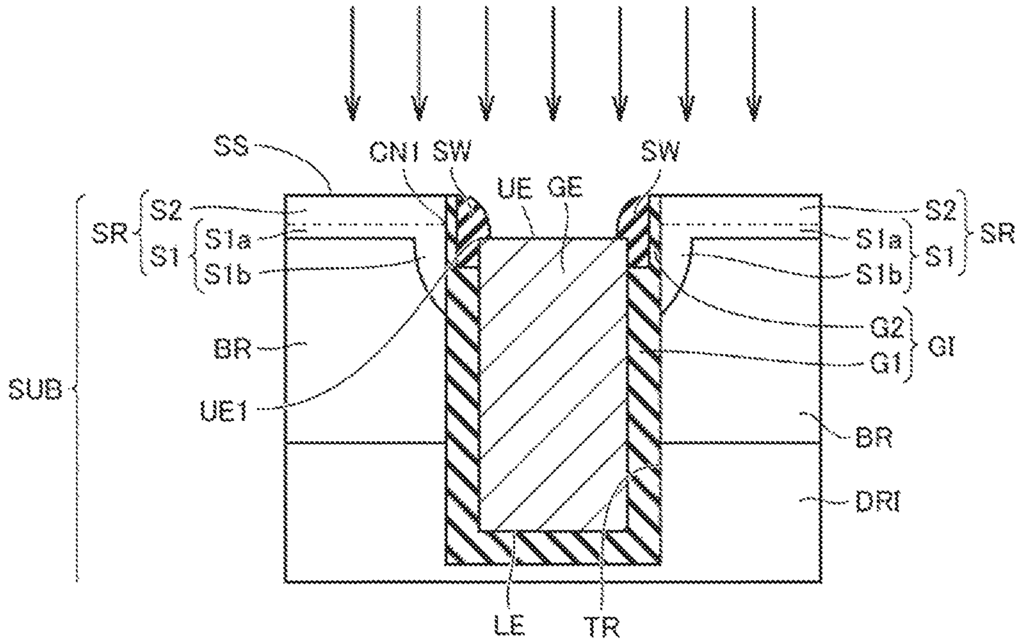
FIG. 21 is a sectional view showing a second step of a manufacturing method of the semiconductor device according to the second embodiment.

Further, in the present embodiment, as shown in FIG. 20, the first region S1 is formed along the side wall of the trench TR by obliquely implanting the impurity ions before forming the sidewall insulating film SW. This makes it possible to form the first region S1 up to a deep position on the first surface FS side with low implantation energy. Therefore, implantation variations during the ion implantation can be suppressed.

MODIFICATION EXAMPLE

Next, a configuration of a semiconductor device according to a modification example will be described with reference to FIG. 22.

Figure 22:
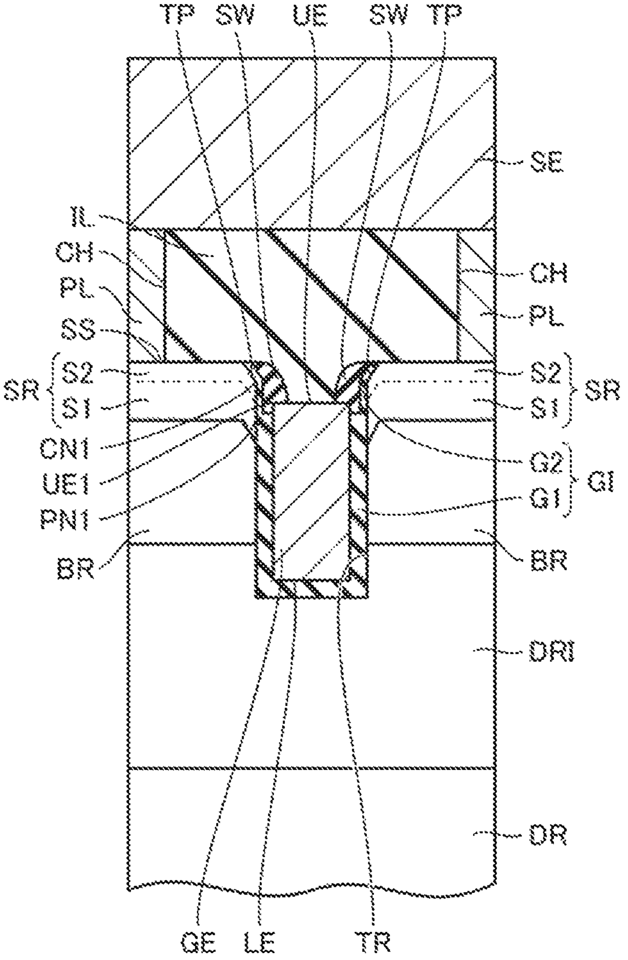
FIG. 22 is a sectional view showing a configuration of a semiconductor device according to a modification example.

As shown in FIG. 22, a tapered portion TP may be provided at a connection portion with the second surface SS on the side wall of the trench TR. The tapered portion TP is inclined so that an opening dimension of the trench TR is enlarged. The tapered portion TP is also covered with the second insulating film G2 of the gate insulating film G1. Further, the tapered portion TP is covered with the sidewall insulating film SW with the second insulating film G2 interposed therebetween.

Incidentally, since a configuration of the modification example other than the above-mentioned configuration is substantially the same as the configuration of the first embodiment, the same elements are denoted by the same reference numerals, and a description thereof will not be repeated.

Also in the second embodiment, a tapered portion TP identical or similar to that in the above-mentioned modification example may be provided.

As explained above, the invention made by the present inventor has been specifically described based on the embodiments, but the present invention is not limited to the above-mentioned embodiments and, needless to say, can be variously modified within a range not departing from the scope thereof.

What is claimed is:

1. A semiconductor device comprising:
- a semiconductor substrate having a first surface, a second surface opposing the first surface, and a trench extending from the second surface toward the first surface;
- a gate electrode arranged in the trench with a gate insulating film interposed therebetween;
- a recess portion formed between the gate electrode and the gate insulating film; and
- a source region arranged in the semiconductor substrate,
- wherein the gate electrode has a lower end located at a bottom of the trench and an upper end opposing the lower end, and the upper end is located in a first surface side with respect to the second surface,
- wherein the source region has a first region having a first concentration and a second region having a second concentration higher than the first concentration,
- wherein the first region has a portion located in the first surface side with respect to the upper end of the gate electrode,
- wherein the second region is located in a second surface side with respect to the upper end of the gate electrode,
- wherein the gate insulating film comprises:
  - a first insulating film arranged along a bottom wall of the trench and a lower side of a side wall of the trench; and
  - a second insulating film located in an upper side with respect to the first insulating film, and arranged along the side wall of the trench,
- wherein, in a direction orthogonal to a direction from the second surface to the first surface, a thickness of the second insulating film is thinner than a thickness of the first insulating film, and
- wherein a bottom wall of the recess portion is formed by an upper surface of the first insulating film, one side wall of the recess portion is formed by a side wall of the gate electrode, and another side wall of the recess portion is formed by a side wall of the second insulating film.

2. The semiconductor device according to claim 1, further comprising a sidewall insulating film arranged along a side wall of the trench in the second surface side with respect to the gate insulating film.

3. The semiconductor device according to claim 1, wherein the first region has a first portion located away from the trench and a second portion extending along a side wall of the trench in the first surface side with respect to the first portion.

4. The semiconductor device according to claim 3, wherein an end portion of the second portion in the first surface side is located in the first surface side with respect to the upper end of the gate electrode.

5. The semiconductor device according to claim 1,
- wherein an end portion of the first insulating film in the second surface side is located in the first surface side with respect to a position of the upper surface of the gate electrode, and
- wherein the second insulating film is connected to the end portion of the first insulating film in the second surface side.

* * * * *